US011616057B2

(12) United States Patent
Majhi et al.

(10) Patent No.: US 11,616,057 B2
(45) Date of Patent: Mar. 28, 2023

(54) IC INCLUDING BACK-END-OF-LINE (BEOL) TRANSISTORS WITH CRYSTALLINE CHANNEL MATERIAL

(71) Applicant: Intel Corporation, Santa Clara, CA (US)

(72) Inventors: Prashant Majhi, San Jose, CA (US); Abhishek Sharma, Hillsboro, OR (US); Brian Doyle, Portland, OR (US); Ravi Pillarisetty, Portland, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 777 days.

(21) Appl. No.: 16/367,144

(22) Filed: Mar. 27, 2019

(65) Prior Publication Data

US 2020/0312839 A1 Oct. 1, 2020

(51) Int. Cl.
*H01L 27/06* (2006.01)
*H01L 23/528* (2006.01)
*H01L 21/02* (2006.01)
*H01L 29/267* (2006.01)

(52) U.S. Cl.
CPC .... *H01L 27/0688* (2013.01); *H01L 21/02645* (2013.01); *H01L 21/02667* (2013.01); *H01L 23/528* (2013.01); *H01L 29/267* (2013.01)

(58) Field of Classification Search
CPC ............. H10L 27/0688; H01L 27/1218; H01L 27/0605; H01L 27/088; H01L 29/267; H01L 29/785; H01L 27/0207; H01L 29/263; H01L 21/02645; H01L 21/02667; H01L 23/528; H01L 21/8258
See application file for complete search history.

(56) References Cited

U.S. PATENT DOCUMENTS

| | | |
|---|---|---|
| 5,995,187 A | 11/1999 | Wakagi et al. |
| 6,271,542 B1 | 8/2001 | Emma et al. |
| 6,319,761 B1 | 11/2001 | Zhang et al. |
| 6,787,914 B2 | 9/2004 | Fortin |
| 2003/0201442 A1 | 10/2003 | Makita et al. |
| 2004/0065913 A1 | 4/2004 | Shimada et al. |
| 2004/0114422 A1* | 6/2004 | Yabe ...................... G11C 11/412 365/154 |

(Continued)

*Primary Examiner* — Galina G Yushina
(74) *Attorney, Agent, or Firm* — Essential Patents Group, LLP

(57) ABSTRACT

IC device including back-end-of-line (BEOL) transistors with crystalline channel material. A BEOL crystalline seed may be formed over a dielectric layer that has been planarized over a front-end-of-line (FEOL) transistor level that employs a monocrystalline substrate semiconductor. The BEOL crystalline seed may be epitaxial to the substrate semiconductor, or may have crystallinity independent of that of the substrate semiconductor. The BEOL crystalline seed may comprise a first material having a higher melt temperature than a melt material formed over the seed and over the dielectric layer. Through rapid melt growth, the melt material may be heated to a temperature sufficient to transition from an as-deposited state to a more crystalline state that is derived from, and therefore associated with, the BEOL crystalline seed. A BEOL transistor may then be fabricated from the crystallized material.

16 Claims, 8 Drawing Sheets

(56) References Cited

U.S. PATENT DOCUMENTS

| | | |
|---|---|---|
| 2005/0156217 A1 | 7/2005 | Shimada et al. |
| 2006/0003503 A1 | 1/2006 | Yang et al. |
| 2007/0007571 A1 | 1/2007 | Lindsay et al. |
| 2007/0181953 A1* | 8/2007 | Lyu .................... H01L 21/8221 257/382 |
| 2009/0149012 A1 | 6/2009 | Brask et al. |
| 2010/0103159 A1 | 4/2010 | Leon |
| 2010/0117147 A1 | 5/2010 | Kim et al. |
| 2011/0147856 A1 | 6/2011 | Sasaki et al. |
| 2011/0266537 A1 | 11/2011 | Ye |
| 2013/0248852 A1 | 9/2013 | Yokozeki |
| 2014/0183525 A1 | 7/2014 | Kaneko et al. |
| 2014/0191237 A1 | 7/2014 | Hekmatshoartabari et al. |
| 2014/0377906 A1 | 12/2014 | Lin et al. |
| 2015/0255139 A1 | 9/2015 | Atsumi et al. |
| 2015/0263176 A1 | 9/2015 | Cheng |
| 2015/0303311 A1 | 10/2015 | Yu et al. |
| 2015/0357480 A1 | 12/2015 | Yu et al. |
| 2016/0035755 A1 | 2/2016 | Li et al. |
| 2016/0086802 A1 | 3/2016 | Hong et al. |
| 2017/0186783 A1 | 6/2017 | Hu |
| 2018/0004883 A1 | 1/2018 | Yuan et al. |
| 2018/0158843 A1 | 6/2018 | Lius et al. |
| 2018/0158944 A1* | 6/2018 | Mohapatra ............ H01L 29/785 |
| 2018/0301380 A1 | 10/2018 | Or-Bach et al. |
| 2018/0307039 A1* | 10/2018 | Payne .................. G02B 5/0833 |
| 2020/0350412 A1 | 11/2020 | Ku et al. |
| 2021/0083050 A1* | 3/2021 | Hussain ................ H01L 29/775 |

\* cited by examiner

IC INCLUDING BACK-END-OF-LINE (BEOL) TRANSISTORS WITH CRYSTALLINE CHANNEL MATERIAL

BACKGROUND

Device density in integrated circuits (ICs) has increased for decades in conformance with Moore's law. However, as the lateral dimensions of a device structure shrink with each technology generation, it becomes increasingly difficult to further reduce structural dimensions. Three-dimensional (3D) scaling is now of considerable interest as another avenue of increasing overall device density and IC performance Some forms of 3D scaling may be achieved through chip stacking or packaged IC stacking, for example. Another form of 3D scaling is within a single chip, which may be referred to as "monolithic" integration. In a monolithic 3D IC, multiple levels of active devices (e.g., transistors) are electrically coupled through one or more metal interconnect layers.

Many monolithic 3D integration techniques rely on expensive substrates, such as semiconductor on insulator (SOI) substrates, and the transfer of a semiconductor material layer from a donor substrate. For example, a semiconductor layer from one SOI substrate may be bonded over interconnect levels fabricated above transistors formed during front-end-of-line (FEOL) processing. Because the transferred layer can be substantially monocrystalline, transistors that utilize the transferred layer as a channel material may offer significant performance advantageous over transistors that utilize an amorphous or polycrystalline thin film semiconductor otherwise formed during back-end-of line (BEOL) processing. However, monolithic 3D ICs fabricated through layer transfer technology remains cost prohibitive and/or fraught with manufacturing issues that pose a barrier to high volume manufacturing (HVM). Alternative monolithic 3D IC architectures and fabrication techniques capable of providing BEOL transistors having superior channel material quality (and therefore performing on par with FEOL transistors) would be advantageous.

BRIEF DESCRIPTION OF THE DRAWINGS

The material described herein is illustrated by way of example, and not by way of limitation, in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
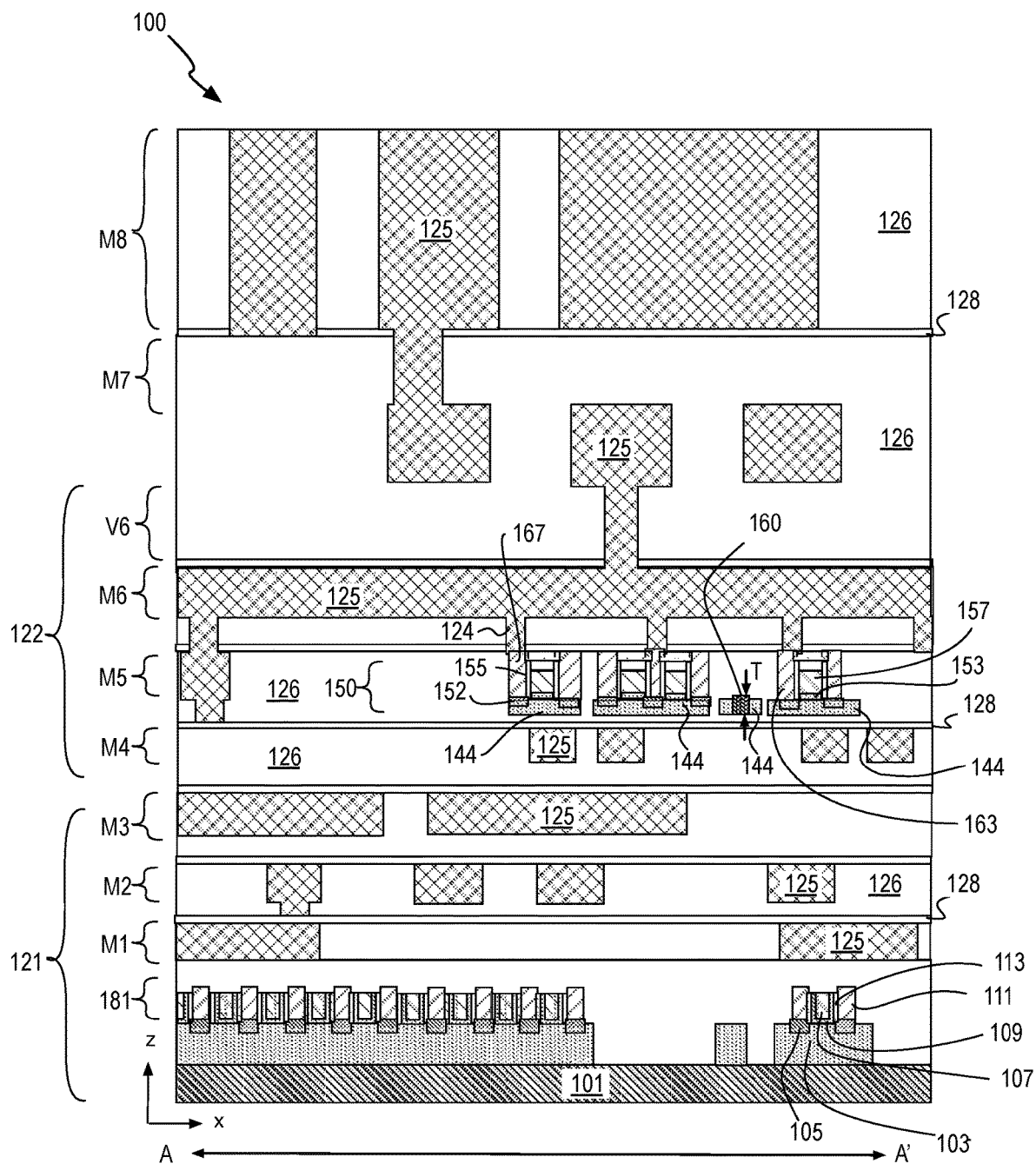
FIG. 1A illustrates a cross-sectional side view of a 3D IC structure, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material "on" a second material is in direct contact with that second material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

3D IC structures including a back-end-of-line BEOL transistor with crystalline channel material are described herein. BEOL transistors are within, and/or between, various interconnect metallization levels of a 3D IC. With high quality channel material, these BEOL transistors may have performance characteristics that more nearly perform as well as front-end-of-line (FEOL) transistors that employ substantially monocrystalline channel material. A BEOL transistor with crystalline channel material in accordance with embodiments herein may be contrasted with a thin-film transistor (TFT), which instead has transistor channel material that is either amorphous, or a microstructure that is randomly polycrystalline. While TFT performance is suitable for some applications, performance characteristics of a TFT, such as drive current and leakage, are inferior to typical FEOL field effect transistors (FETs). The higher quality channel material of BEOL transistors in accordance with embodiments herein has at least significant crystalline texture, and may be substantially single crystalline. As such, drive currents may be much higher than is possible with a TFT and/or leakage currents much lower than is possible with a TFT.

BEOL transistor structures described herein may nevertheless be fabricated in a manner that is more scalable and/or less expensive than layer transferred channel materials. As described further below, a crystalline seed may be formed in the BEOL, for example, over a dielectric layer that has been planarized over a front-end-of-line (FEOL) transistor level. This crystalline seed may be epitaxial to a substrate semiconductor, or may have crystallinity independent of that of a substrate semiconductor. Although a number of examples are described below, the crystalline seed may advantageously comprise a seed material having a higher melt temperature than a melt material that is formed over the seed. A rapid melt growth is performed, during which the melt material is heated to a temperature sufficient for it to transition from as-deposited state (e.g., amorphous, randomly polycrystalline, etc.) to a more ordered crystalline state that is derived from, and therefore associated with, crystallinity of the seed material. Once crystallized, further BEOL processing may then be practiced, for example to form electrically isolated islands, epitaxially grow further material(s), form transistor terminals (e.g., gate, source, and drain terminals), to complete BEOL transistor (e.g., FET) fabrication. Further BEOL processing may be practiced to then electrically interconnect the BEOL transistors into circuitry that may further include FEOL transistors, such as MOSFETs located in a region of a monocrystalline semiconductor device layer (e.g., silicon substrate).

FIG. 1A illustrates a cross-sectional side view of a 3D IC structure 100, in accordance with some embodiments. Structure 100 illustrates a portion of a monolithic IC that includes FEOL device circuitry 121 fabricated over and/or on a substrate 101. In this example, FEOL device circuitry 121 includes a plurality of MOSFETs 181 that employ a monocrystalline semiconductor material 103 for at least a channel region of each transistor. In other embodiments, FEOL device circuitry 121 includes other types of transistors (e.g., bipolar junction transistor, etc.), or other active devices employing one or more semiconductor materials (e.g., diodes, lasers, etc.). FETs 181 include a gate terminal 107 separated from a semiconductor material 103 by a gate dielectric 109. The channel region of semiconductor material 103 separates semiconductor terminals 105 (source semiconductor and drain semiconductor). Contact metallization 111 is in contact with semiconductor terminals 105 and is separated from gate terminal 107 by an intervening dielectric spacer 113. Any materials and techniques known to be suitable for FETs may be present in FEOL FETs 181. FETs 181 may be planar or non-planar devices. In some advantageous embodiments, FETS 181 are finFETs. FETs 181 may include one or more semiconductor materials. As one example, semiconductor material 103 is a surface layer of a substantially monocrystalline substrate 101. Substrate 101 may be any material known to be suitable for the fabrication of MOSFET (CMOS) circuitry, such as, but not limited to, group IV materials (e.g., substantially pure silicon, substantially pure germanium, and SiGe alloys that may range from predominantly Si to predominantly Ge).

FEOL device circuitry 121 may further include one or more levels of interconnect metallization 125 electrically insulated by dielectric materials 126, 128. In the exemplary embodiment illustrated, FEOL device circuitry 121 includes metal-one (M1), metal-two (M2) and metal-three (M3) interconnect metallization levels. Interconnect metallization 125 may be any metal(s) suitable for FEOL and/or BEOL IC interconnection. Interconnect metallization 125, may be, for example, an alloy of predominantly Cu, an alloy of predominantly W, or an alloy of predominantly Al, etc. Dielectric material 126 may be any dielectric material known to be suitable for electrical isolation of monolithic ICs. In some embodiments, dielectric material 126 comprises silicon, and at least one of oxygen and nitrogen. Dielectric material 126 may be SiO, SiN, or SiON, for example. Dielectric material 126 may also be a low-K dielectric material (e.g., having a dielectric constant below that of $SiO_2$). Dielectric material 128 has a different composition that dielectric material 126, and may be of a composition that has a higher dielectric constant than that of dielectric material 126. In some examples where dielectric material 126 is predominantly silicon and oxygen (i.e., $SiO_x$), dielectric material 128 is predominantly silicon and nitrogen (i.e., $SiN_x$).

BEOL device circuitry 122 is located over FEOL device circuitry 121, with dielectric material 126 therebetween. As shown, BEOL device circuitry 122 includes a plurality of FETs 150 that employ a crystalline semiconductor material 144 for at least a channel region of each transistor. In other embodiments, BEOL device circuitry 122 includes other types of transistors (e.g., bipolar junction transistor, etc.), or other active devices employing one or more crystalline semiconductor materials (e.g., diodes, lasers, etc.). For the illustrated embodiments, individual ones of transistors 150 include a gate terminal (electrode) 155 separated from a channel region of semiconductor material 144 by a gate dielectric 153. In the exemplary embodiment illustrated, FETs 150 are "top-gate" devices with gate terminal 155 over semiconductor material 144. A dielectric spacer 155 separates a sidewall of gate terminal 155 from semiconductor terminal contact metallization 163, which lands on source and drain regions 152. Although top-gate devices are illustrated for the sake of clarity, embodiments herein are also applicable bottom-gate transistor architectures, side-gate transistor architectures, as well as other transistor architectures.

Gate terminals 107 and/or 157 may have any composition known to be suitable for controlling the channel conductivity. Gate terminals 107 and/or 157 may have any suitable work function and may include an elemental metal layer, a metal alloy layer, and/or laminate structure. In some embodiments, gate terminals 107 and/or 157 comprise a metal nitride, such as TiN. Gate terminals 107 and/or 157 may also comprise Al (e.g., TiAlN). Other alloy constituents may also be employed, such as, but not limited to, C, Ta, W, Pt, and Sn. Gate dielectric 109 and/or 153 may each be any gate dielectric material known to be suitable for semiconductor material 103 or, semiconductor material 144, respectively, in some exemplary embodiments gate dielectric 109 and/or 153 includes at least one layer of a high-k dielectric material (e.g., having a bulk relative permittivity greater than 9). Exemplary high-k materials include electrically resistive metal oxides, such as, but not limited to, metal oxides (e.g., $Al_2O_3$, $HfO_2$, $MgO_x$, and $LaO_x$), and mixed-metal oxides (e.g., $HfAlO_x$). Dielectric spacer 113 and/or 155 may be any dielectric such as, but not limited to, silicon dioxide, silicon nitride, or silicon oxynitride, or any known low-k material.

Contact metallization 111 and 163 may each have any composition known to provide a suitable contact to semiconductor materials 103 and 144, respectively. Contact metallization 111 and/or 163 may form a Schottky or ohmic junction with source/drain semiconductor material. Contact metallization 111 and/or 163 may include, for example, one or more metals or metallic compounds. In some embodiments, contact metallization 111 includes a metal nitride at the interface of (i.e., in direct contact with) source/drain semiconductor 105. In some embodiments, contact metallization 163 includes a metal nitride at the interface of (i.e., in direct contact with) source/drain semiconductor 152. Exemplary metal nitrides include TiN, TaN, and WN. Contact metallization 111 and 163 may also, or in the alternative, include a noble metal (e.g., Pt) at the interface of (i.e., in direct contact with) source/drain semiconductor 105, or 152, respectively.

BEOL circuitry 122 may comprise any number of metallization levels over FETs 150, such as a metallization level (e.g., M6) immediately above the metallization level (e.g., M5) in which transistors 150 reside. As further shown, a via 124 electrically connects interconnect metallization levels to contact metallization 167 landing on transistor semiconductor terminals (e.g. drain semiconductor or source semiconductor). Any number of interconnect metallization levels may be employed to couple BEOL circuitry 122 to the underlying FEOL device circuitry 121. In the example shown in FIG. 1A, metallization levels of BEOL circuitry 122 (e.g., M8) may be routed down through any number of metallization levels (e.g., M8-M3) to be in electrical communication with one or more FEOL transistors 121.

In some embodiments, a device level within BEOL circuitry further includes a seed structure. The seed structure comprises a crystalline material including one or more grains that impart a suitable long-range order to the microstructure of BEOL semiconductor material employed in an active device. In the example shown in FIG. 1A, seed structure 160 is laterally adjacent to semiconductor material 144 (i.e., within a same BEOL level) and semiconductor material 144 has microstructure associated with that of seed structure 160. In some embodiments, semiconductor material 144 is in direct contact with a sidewall of seed structure 160, as illustrated. In some other embodiments, semiconductor material 144 is in direct contact with a top surface of seed structure 160. In still other examples, a dielectric material (e.g., dielectric material 126) may completely separate a seed structure from adjacent semiconductor material, for example as a result of BEOL processing that electrically isolates various ones of FETs 150.

In some embodiments, one or more dielectric materials may separate a seed structure from an underlying FEOL device level and/or underlying crystalline substrate. For such examples, crystallinity of the seed structure may be completely independent of a semiconductor substrate. In the embodiment illustrated in FIG. 1A, seed structure 160 is on dielectric material 126 with both dielectric materials 126 and 128 separating seed structure 160 from substrate 101 and/or semiconductor material 103. One or more interconnect metallization levels may also separate seed structure 160 from substrate 101 and/or semiconductor material 103. Seed structure 160 may therefore have any crystallinity, for example as may be defined through a deposition and/or anneal of seed material.

Seed structure 160 may comprise any material known to be crystalline when deposited and/or annealed over an amorphous material, such as dielectric materials 126 and/or 128. In some such embodiments, seed structure 160 comprises a metal. In some specific examples, seed structure 160 comprises at least one of Mo, Ru, Co, Ti or Al. In some further embodiments, seed structure 160 comprises predominantly a metal and nitrogen (e.g., TiN, AN, TiAlN, etc.). Other metals (e.g., Mg) are also possible, as are metal oxides (e.g., MgO). Although seed structure 160 may advantageously be single crystalline, seed structure 160 may include more than one crystal grain. For such polycrystalline embodiments however, individual grains of seed structure 160 advantageously occupy an entire thickness T of seed structure 160. In other words, at least a sidewall of seed structure 160 over some lateral dimension is single crystalline. Seed thickness T may vary, but in some examples is less than 100 nm, and may be 25-75 nm for example.

Thickness of semiconductor material 144 may also vary, but in some exemplary embodiments is less than 50 nm, and advantageously less than 30 nm (e.g., 5-25 nm). Thicknesses below 50 nm may result in superior crystalline quality, for example as a more complete and/or rapid crystallization of semiconductor material 144 may be achieved. In some embodiments, semiconductor material 144 comprises a different material than seed structure 160. In exemplary embodiments, semiconductor material 144 comprises a material having a melt temperature, which is sufficiently lower than that of seed structure 160. The melt temperature differential may allow semiconductor material 144 to crystallize from a seeding surface (e.g., sidewall or top) of seed structure 160 without significant dissolution of seed structure 160. Hence, semiconductor material 144 advantageously has a composition that can undergo a phase transition (e.g., from amorphous or randomly polycrystalline) into a more order state (e.g., textured or substantially monocrystalline) at some temperature below which the crystallinity of seed structure 160 is completely lost. In some embodiments, semiconductor material 144 has a melt temperature that is at least 50° C., and advantageously at least 100° C., below the melt temperature of seed structure 160.

The device structures described herein are applicable to any semiconductor material that has a suitable melt temperature differential with that of seed structure 160. Semiconductor material 144 may therefore be a p-type, n-type, or intrinsic semiconductor material. Semiconductor material 144 may be a group IV semiconductor material such as silicon (Si), germanium (Ge), and alloys such as SiGe GeSn, and SiGeSn. As described further below, localized/rapid thermal techniques may be employed to generate a very high thermal gradient between semiconductor material 144 and underlying materials so as to crystallize semiconductor material 144 with minimal impact to the FEOL circuitry 121, and/or metallization 125.

In some embodiments, semiconductor material 144 is a material that will crystallize from a less-ordered, as-deposited state at a temperature below 500° C. Semiconductor material 144 may be a group III—V alloy semiconductor material with a first sub-lattice of at least one element from group III of the periodic table (e.g., Al, Ga, In), and a second sub-lattice of at least one element of group V of the periodic table (e.g., P, As, Sb). Semiconductor material 144 may be a binary, ternary, or quaternary III-V semiconductor alloy. Many III-V semiconductor materials display relatively low melt temperatures with InGaAs (e.g., $In_{0.53}Ga_{0.47}As$) being just one example.

Regardless of composition, semiconductor material 144 has microstructure associated with that of seed structure 160. Semiconductor material 144 may be substantially monocrystalline or polycrystalline (e.g., having micro-scale to nano-scale crystal grains), but if polycrystalline the crystal grains have texture, with grain orientation being non-random and instead attributable to, or associated with, one or more crystal grain of seed structure 160. For example, seed structure 160 may have a crystal structure (e.g., cubic, hexagonal, etc.) with a particular orientation (e.g., <111>, <100>, c-axis, etc.) relative to the plane of substrate 101 (e.g., x-y plane). In some embodiments where semiconductor material 144 is substantially monocrystalline, semiconductor material 144 has contiguous crystal structure and an orientation epitaxial to (propagated from) that of seed structure 160. In some other embodiments where semiconductor material 144 is polycrystalline, semiconductor material 144 has significant crystalline texture associated with (propagated from) the crystal structure and orientation of seed structure 160.

Figure 1B:
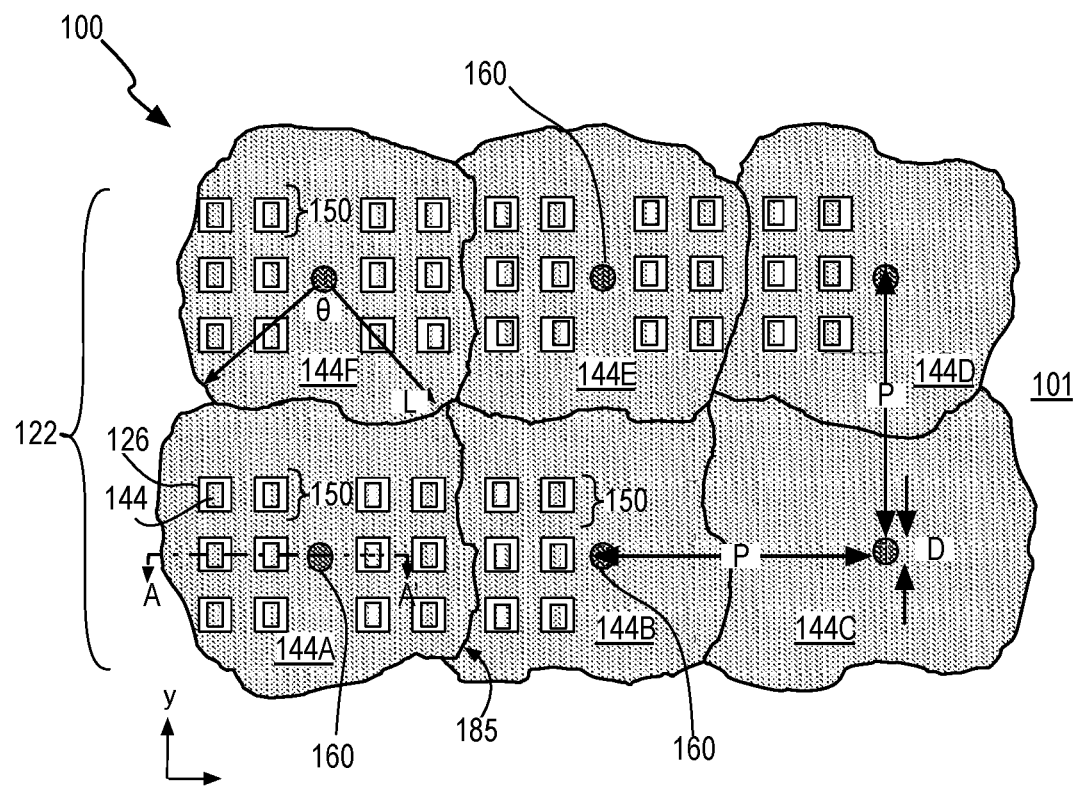
FIG. 1B illustrates a plan view of a device level in the 3D IC structure shown in FIG. 1A, in accordance with some embodiments.

FIG. 1B illustrates a plan view of a device level in 3D IC structure 100, in accordance with some embodiments. The A-A' line shown in FIG. 1B demarks the sectional view of FIG. 1A. As shown in FIG. 1B, seed structure 160 has a minimum lateral dimension (e.g., diameter) D. The minimum lateral seed dimension D may be defined by an etch process, or other technique employed to pattern seed structure 160. Although minimum lateral seed dimension D may vary, lateral seed dimension D may be defined so as to limit the number of grains present within seed structure 160, for example to not exceed some threshold (e.g., 1, 2, 3 grains, etc.). In some embodiments, D is less than 300 nm, and advantageously less than 200 nm (e.g., 25-100 nm). Minimum lateral seed dimension D is illustrated as being approximately the same in both x and y dimensions, which may advantageously minimize a number of grains within seed structure 160. However, lateral seed dimensions may exceed the minimum lateral seed dimension D in one dimension, for example where seed structure 160 is elongated.

For embodiments where grains within a seed material are equal to, or larger than, a minimum lateral seed dimension D), only a few (e.g., 1-3) grains are likely to be present within a seed structure 160. As such there may be few, if any, grain boundaries present within an area of seed structure 160. These few grains may then be associated with crystallinity of semiconductor material 144 emanating from seed structure 160 over an azimuthal angle θ about a perimeter of seed structure 160 (e.g., within the illustrated x-y plane). In the example illustrate in FIG. 1B, seed structure 160 is single crystalline such that semiconductor material 144 comprises an epitaxial crystal spanning a 360° azimuthal angle θ about seed structure 160 and extending some lateral crystal length L from seed structure 160.

Multiple seed structures 160 may be present within a single BEOL device layer, particularly where lateral crystal length L is smaller than a footprint of BEOL circuitry 122. In the example shown in FIG. 1B, a plurality of seed structures 160 is arrayed over an area of BEOL circuitry 122. In this example, seed structures 160 have a fixed lateral grid pitch P, which may be predetermined to form intersecting crystals based on a predetermined lateral crystallization rate for semiconductor material 144. Although seed grid pitch P may vary, in some embodiments where minimum seed dimension D is less than a few hundred nanometers, seed grid pitch P is at least a micrometer, and may be 10 μm, or more.

In some embodiments, where seed structures are independent of any shared crystal reference, such as a semiconductor substrate, semiconductor around each seed may have different crystallinity that is associated with one particular seed structure. For example, where seed structures 160 have crystallinity independent of each other, a plurality of crystalline zones 144A, 144B, 144C, 144D, 144E, 144F are present, with one zone around each of the plurality of seed structures 160. In some embodiments there is a single crystal within each crystalline zone 144A-144F. In such single crystalline embodiments, there may be only one grain boundary 185 at the interface of two adjacent crystalline zones (e.g., 144A and 144B). In some embodiments, grain boundary 185 is a small angle grain boundary (e.g., crystal orientation within zone 144A nearly matches crystal orientation within zone 144B). In other embodiments, semiconductor material 144 within each crystalline zone 144A-144F is polycrystalline with texture that is associated with one of the plurality of seed structures 160. In such polycrystalline embodiments, many more grain boundaries (not depicted) may be present, and grain boundary 185 is then a boundary where crystal texture may transition from a first texture in zone 144A that is associated with a first seed structure 160, to a second texture in zone 144B that is associated with a second seed structure 160.

Within a BEOL device layer, one or more active devices may include semiconductor material of a given crystallinity. While not all FETs of BEOL transistor circuitry may have exactly the same crystallinity, each of FETs may nevertheless display superior performance associated with a higher quality (more crystalline) semiconductor material. As further shown in FIGS. 1A and 1B for example, multiple FETs 150 are adjacent to one seed structure 160. In the plan view, each FET 150 occupies only a portion of a given crystal zone 144A-144F. In an example where FETs 150 have a lateral pitch of 100 nm, or less, many such FETs may be present within a crystalline zone having a lateral crystal length L of 1 μm, or more. As such, within a crystalline zone (e.g., 144A) FETs 150 will therefore all have semiconductor material 144 with like crystallinity (e.g., being the same crystal or having the same crystalline texture). Within another crystalline zone (e.g., 144B), FETs 150 will again all have semiconductor material 144 of like crystallinity (e.g., being the same crystal or having the same crystalline texture), which may be different than that of semiconductor material 144 within crystalline zone 144A.

In some embodiments, dielectric material separates semiconductor material 144 into separate devices and/or islands. This dielectric material may function as electrical isolation between to adjacent BEOL devices. In the example shown in FIGS. 1A and 1B, dielectric material 126 surrounds, or is a perimeter about, one or more FETs 150. In the plan view shown in FIG. 1B, within one crystal zone (e.g., 144A) crystalline semiconductor material 144 on an inside of a frame of dielectric material 126 has the same crystallinity as crystalline semiconductor material 144 on an outside of the frame of dielectric material 126.

Figure 1C:
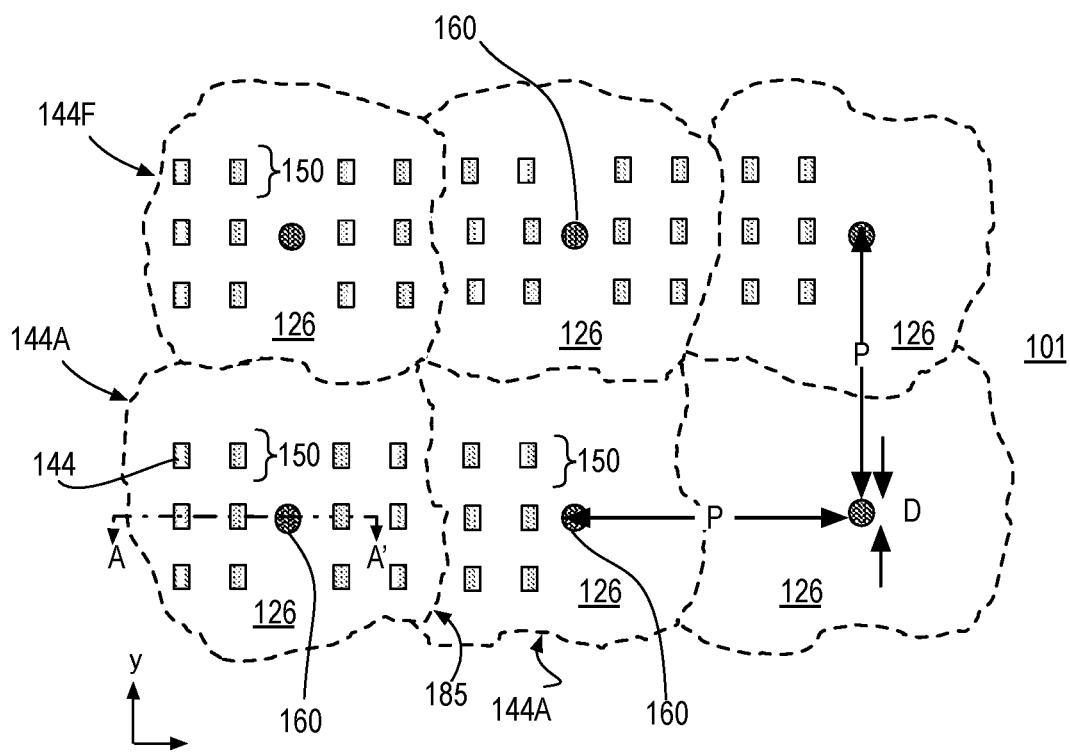
FIG. 1C illustrates a plan view of a device level in the 3D IC structure shown in FIG. 1A, in accordance with some alternative embodiments.

FIG. 1C illustrates a plan view of a device level in 3D IC structure 100, in accordance with some alternative embodiments where only a small portion of semiconductor material 144 is retained within the confines of one or more FETs 150. The crystalline association between semiconductor 144 and proximal seeds structures 160 may still be evident even with more significant patterning of semiconductor material 144. FIG. 1C illustrates in dashed line a former grain boundary 185 between two neighboring crystal zones (e.g., 144A and 144B). Although grain boundary 185 is not directly evident following the more extensive patterning of semiconductor material 144, crystallinity of semiconductor 144 within various ones of the FETs 150 is nevertheless still associated with the nearest seed structure 160. The former location of grain boundary 185 may even be approximated down to less than the pitch of FETs 150 through a spatial crystallinity analysis that maps the crystallinity of semiconductor material 144.

Figure 2A:
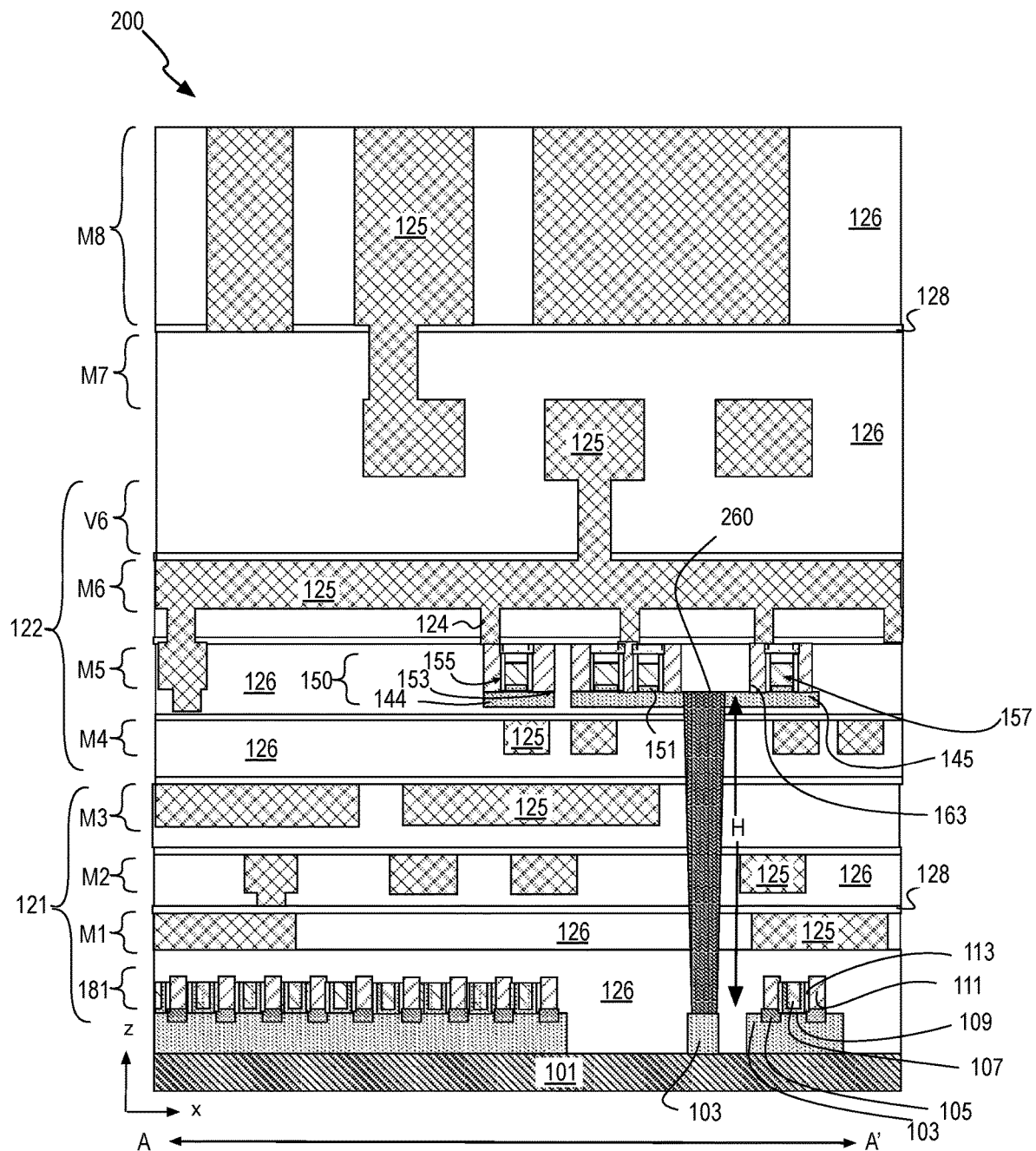
FIG. 2A illustrates a cross-sectional side view of a 3D IC structure, in accordance with some alternative embodiments.
Figure 2B:
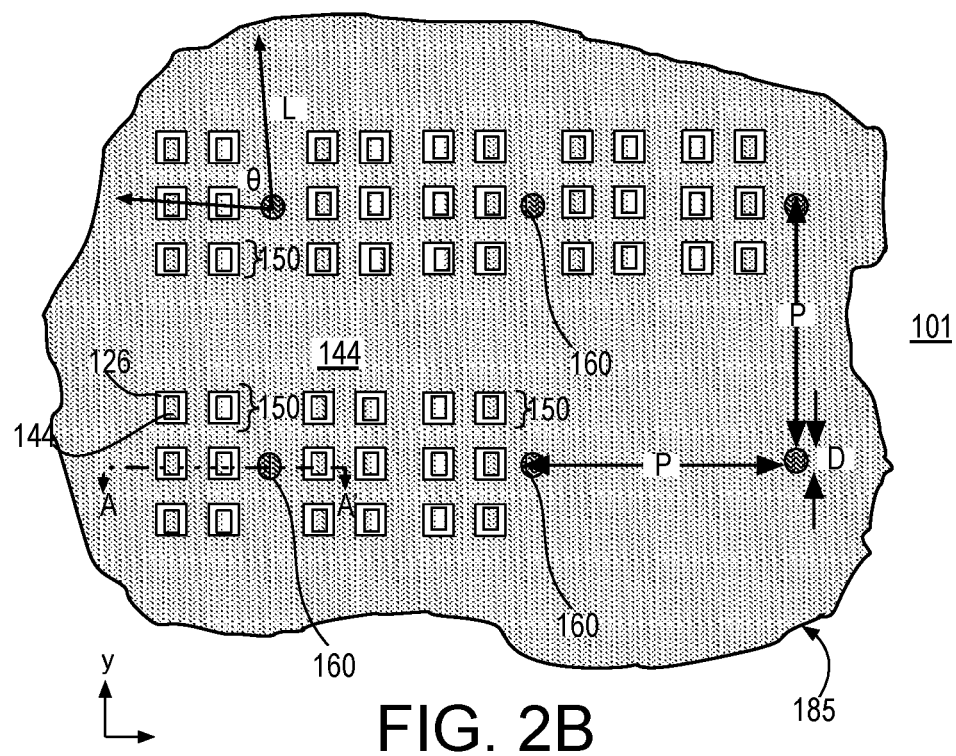
FIG. 2B illustrates a plan view of a device level in the 3D IC structure shown in FIG. 2A, in accordance with some embodiments.
Figure 2C:
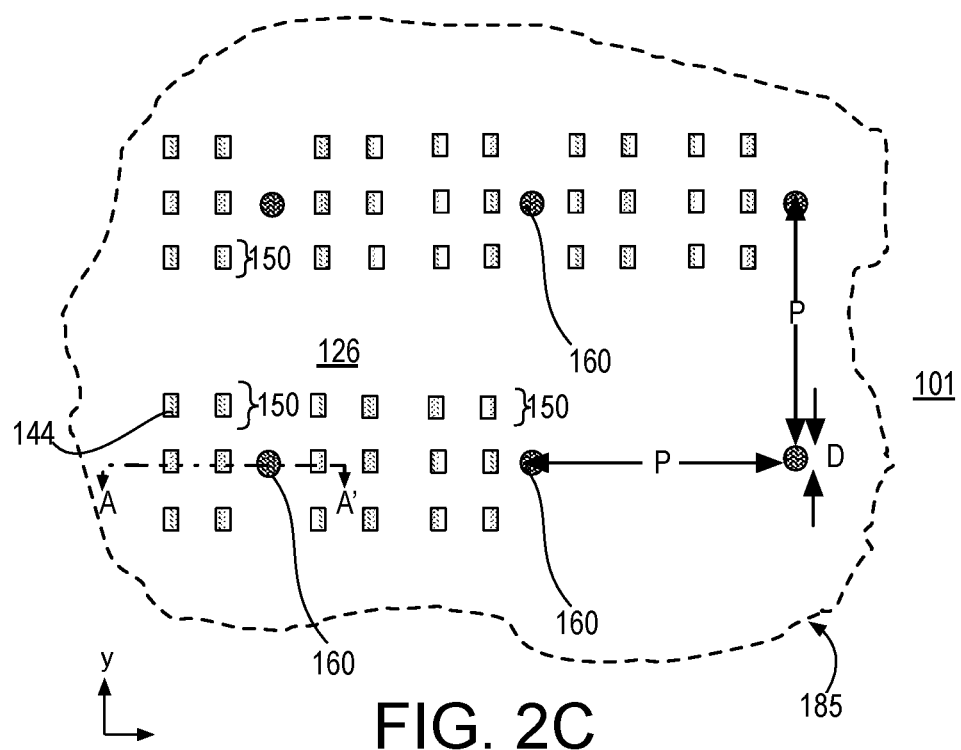
FIG. 2C illustrates a plan view of a device level in the 3D IC structure shown in FIG. 2A, in accordance with some alternative embodiments.

FIG. 2A illustrates a cross-sectional side view of a 3D IC structure 200, in accordance with some alternative embodiments where a BEOL device level includes a seed structure that is epitaxial to a reference crystal of a FEOL device level, or substrate thereof. FIG. 2B illustrates a plan view of a device level in the 3D IC structure 200, in accordance with some embodiments. The A-A' line shown in FIG. 2B demarks the sectional view shown in FIG. 2A. FIG. 2C illustrates a plan view of a device level in 3D IC structure 200, in accordance with some alternative embodiments. Reference labels from IC structure 100 (FIG. 1A-1C) are repeated in IC structure 200 (FIG. 2A-2C) to indicate analogous elements, which may have any of the same attributes described above.

As shown in FIG. 2A, a device level of BEOL circuitry 122 includes semiconductor material 144. The device level further includes a crystalline seed structure 260. In the example illustrated, semiconductor 144 is in contact with a sidewall of seed structure 260. In alternative embodiments, semiconductor material 144 is in contact with a top surface of seed structure 260. In the illustrated examples, seed structure 260 has a z-height H that extends through multiple levels of interconnect metallization 125 (e.g., M1-M4), and multiple levels of dielectric materials 126 and 128. Although four levels of metallization are shown between FEOL circuitry 121 and BEOL circuitry 122, a seed structure between FEOL circuitry 121 and BEOL circuitry 122 may extend through only one metallization level, or less (e.g., with the seed structure extending through only dielectric material). Z-height H may therefore vary from 0.5 μm to 2 μm, for example. Where seed structure 260 comprises a different material than semiconductor material 103, seed structure 260 may have a z-height H that promotes aspect ratio trapping (ART) of crystalline defects, for example terminating defects at sidewalls of seed structure 260. The crystal quality of seed structure 260 may therefore improve over the z-height H with the best quality (lowest defect density) being at the BEOL device level.

Seed structure 260 may have any of the properties and/or attributes described above for seed structure 160 (FIG. 1A-1C). However, unlike seed structure 160, seed structure 260 is epitaxial to underlying semiconductor material 103. Semiconductor material 144, having crystallinity associated with seed structure 260 may therefore also be epitaxial to underlying semiconductor material 103. If semiconductor material 103 is monocrystalline, seed structure 260 and semiconductor material 144 may also be substantially monocrystalline.

In some embodiments, seed structure 260 comprises a semiconductor material having a composition that may be epitaxially grown from a seed surface of semiconductor material 103 at an epitaxial growth temperature compatible with interconnect metallization 125. However, as described above in the context of seed structure 160 (FIG. 1A-1C), the melt temperature of seed structure 260 is advantageously higher than that of semiconductor 144. In some specific examples where semiconductor material 103 is silicon or an alloy comprising Si and Ge, seed structure 260 (FIG. 2A) comprises predominantly Ge (e.g., SiGe with at last 60 at % Ge up to substantially pure Ge). Germanium deposition process may be performed at relatively low temperatures that are compatible with typical FEOL and BEOL interconnect metallizations. Germanium epitaxy may be performed at temperatures of 450° C., or less, for example. For 3D IC structure 200, the composition of semiconductor material 144 may be more limited, for example being materials that have a melt temperature below that of Ge. In some specific examples where seed structure 260 comprises predominantly Ge, semiconductor material 144 is a III—V alloy, such as any of those described above in the context of seed structure 160 (e.g., comprising one or more of In, Ga or As). In other examples where semiconductor material 103 is silicon or an alloy comprising Si and Ge and seed structure 260 comprises a III-V semiconductor alloy (e.g., comprising any or all of In, Ga, and As), semiconductor material 144 may also be a III—V alloy (but of different alloy constituents and/or ratios such that semiconductor material 144 has a lower melt temperature than that seed structure 260). For example, semiconductor material 144 may be a binary, ternary, or quaternary III-V semiconductor alloy (e.g., comprising all of In, Ga, and As).

As noted above, semiconductor material 144 may have a range of thicknesses, but in some exemplary embodiments is less than 50 nm, and advantageously less than 30 nm (e.g., 5-25 nm) for the most rapid crystallization. In further reference to FIG. 2B, seed structure 260 also has a minimum lateral dimension D. The minimum lateral dimension D may be determined through patterning of one or more BEOL dielectric materials (e.g., a via etch) to expose a surface of semiconductor material 103. The minimum lateral seed dimension D may be any dimension that ensures a suitable aspect ratio (e.g., less than 20:1, or 10:1, etc.) based on the z-height H (FIG. 2A). Being epitaxial, seed structure 260 may be substantially monocrystalline for any minimum lateral seed dimension D. In some embodiments, lateral seed dimension D is 0.1 µm-0.2 µm. Although illustrated as having a cylindrical via structure, seed structure 260 may instead be a trench having a longitudinal length significantly larger than its transverse width.

Few, if any, grain boundaries may be present within an area of seed structure 260. Crystallinity of semiconductor material 144 emanating from seed structure 260 over an azimuthal angle θ about a perimeter of seed structure 260 (e.g., within the illustrated x-y plane) may therefore be substantially monocrystalline as depicted in FIG. 2B. As further illustrated, multiple seed structures 260 may be present within a single BEOL device layer. In the example shown in FIG. 2B, a plurality of seed structures 260 is arrayed over an area of BEOL circuitry 122. In this example, seed structures 260 again have a fixed lateral grid pitch P, which may be selected to provide multiple seed surfaces based on a predetermined lateral crystallization rate. Seed grid pitch P may again vary (e.g., 1 µm-10 µm, or more). Seed structures 260 are however all epitaxial to semiconductor material 103, and for embodiments where semiconductor material 103 is monocrystalline, all seed structures 260 will have the same crystallinity As a result, a semiconductor material 144 around each of the plurality of seed structures 260 may be monocrystalline with only a grain boundary 185 at an outer crystallization perimeter beyond an edge of BEOL circuitry 122.

As further shown in FIGS. 2A and 2B, multiple FETs 150 are adjacent to a seed structure 260. In the plan view, each FET 150 occupies only a portion of the footprint of semiconductor material 144. In an embodiment where FETs 150 have lateral pitch of say 100 nm, or less, many such FETs may be present within semiconductor material 144 with all FETs 150 of a BEOL transistor circuitry 122 having exactly the same crystallinity. As noted above, dielectric material may separate semiconductor material 144 into separate devices and/or islands, for example to provide electrical isolation between to adjacent BEOL devices. In the example shown in FIGS. 2A and 2B, dielectric material 126 surrounds one or more FETs 150. In the plan view shown in FIG. 2B, semiconductor material 144 on an inside of a frame of dielectric material 126 has the same crystallinity as semiconductor material 144 on an outside of the frame of dielectric material 126.

FIG. 2C illustrates a plan view of a device level in 3D IC structure 200, in accordance with some alternative embodiments where only a small portion of semiconductor material 144 is retained within the confines of one or more FETs 150. FIG. 2C illustrates in dashed line a former semiconductor material boundary 185. Crystallinity of semiconductor 144 within various ones of the FETs 150 is consistent with each other, and consistent with crystallinity of seed structure(s) 260.

Although in the 3D IC structures 100 and 200, BEOL transistors have a substantially planar channel design (e.g., a top-gate terminal and top-side contacts), non-planar transistor architectures are also possible within BEOL device levels. In some embodiments, a BEOL crystalline semiconductor material is patterned into non-planar structures (e.g., fins) with terminals coupled to these non-planar structures. Constraints on the thickness of a BEOL crystalline semiconductor material (e.g., 20-30 nm) related to achieving long range order may however impose a limit on the height a non-planar body. In some alternative embodiments, non-planar semiconductor bodies may instead be formed over and/or from a BEOL crystalline semiconductor material, in which case any non-planar body height may be achieved.

Figure 3:
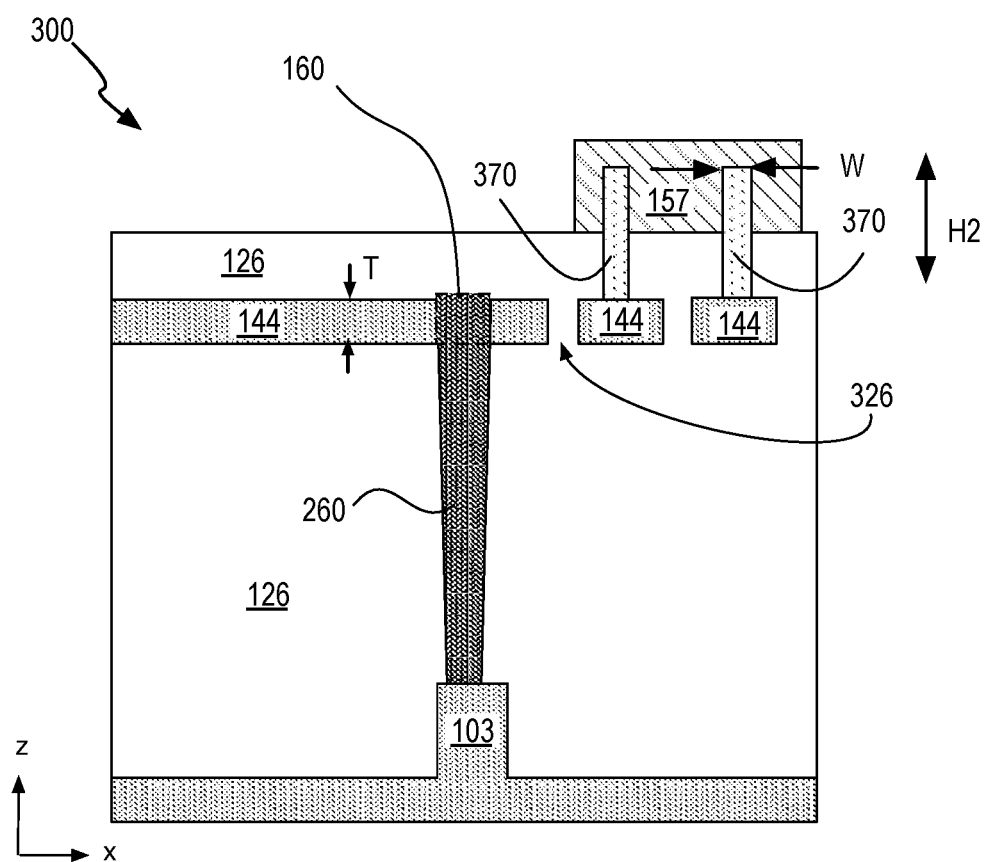
FIG. 3 illustrates a cross-sectional side view of a 3D IC structure including non-planar bodies, in accordance with some embodiments.

FIG. 3 illustrates a cross-sectional side view of a 3D IC structure 300 including non-planar bodies, in accordance with some embodiments. Reference labels from IC structure 100 (FIGS. 1A-1C) and IC structure 200 (FIG. 2A-2C) are repeated in IC structure 300 (FIG. 3) to indicate analogous elements, which may have any of the same attributes described above. 3D IC structure 300 may be present within either of 3D IC structure 100 (FIG. 1A) or 200 (FIG. 2A), for example. As shown in FIG. 3, islands of crystalline semiconductor material 144 are separated by a trench 326 in which there is dielectric material 126, for example to provide electrical isolation between the islands of crystalline semiconductor material 144 and/or between an island of crystalline semiconductor material 144 and a seed structure 260 or 160 (demarked by dashed line).

One or more non-planar semiconductor bodies 370 are in contact with a top surface of crystalline semiconductor material 144. Each non-planar semiconductor body 370 has a z-height H2 that exceeds the thickness T of semiconductor material 144. In some embodiments z-height H2 is more than 30 nm while thickness T is less than 30 nm. Non-planar semiconductor bodies 370 have a lateral width W that may vary, but is generally less than the z-height H2. In some embodiments, lateral width W is less than 30 nm. Lateral width W may therefore be nearly the same as thickness T.

Having been epitaxially grown, or crystallized, from semiconductor material 144, each non-planar semiconductor body 370 has the same crystallinity as semiconductor material 144. Each non-planar semiconductor body 370 may have any semiconductor composition suitable for a device (e.g., transistor channel). In some embodiments, non-planar semiconductor body 370 has substantially the same composition a semiconductor material 144. For example, both semiconductor material 144 and non-planar semiconductor body 370 may be the same III—V alloy (e.g., comprising one or all of In, Ga or As). In some alternative embodiments, non-planar semiconductor body 370 has a different composition than semiconductor material 144. For example, semiconductor material 144 may be a first III—V alloy, and non-planar semiconductor body 370 is a second III—V alloy. Device terminals may be coupled to non-planar semiconductor body 370 in any suitable manner, for example with gate terminal 157 illustrated in FIG. 3 adjacent to a sidewall of semiconductor body 370. Although not depicted, portions of non-planar semiconductor body 370 may comprise electrically active impurities to form n-type and/or p-type source and drain terminals.

Figure 4:
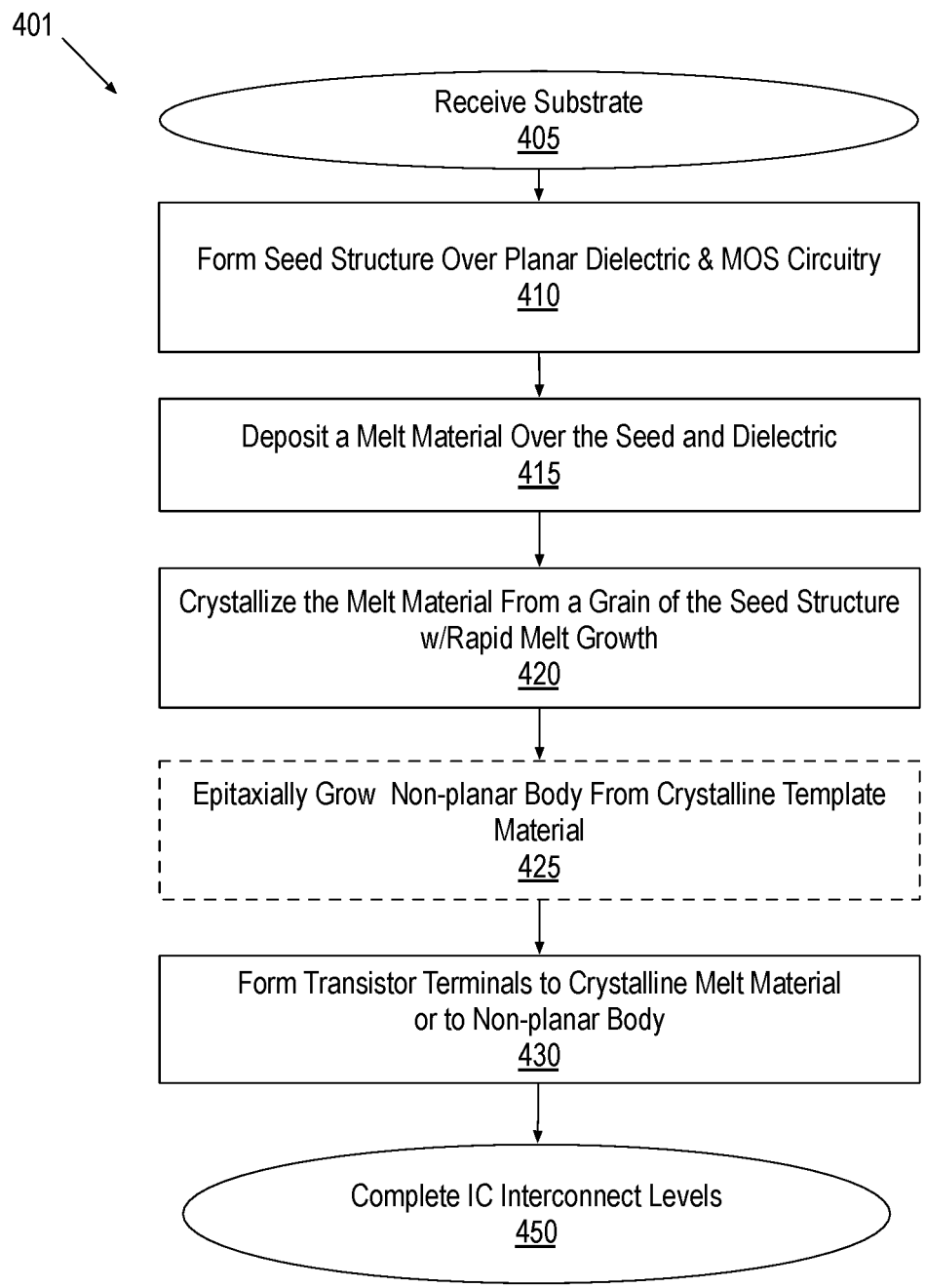
FIG. 4 is a flow diagram illustrating methods for fabricating a 3D IC structure, in accordance with some embodiments.

With certain crystalline BEOL transistor structure features of a 3D IC described above, some exemplary methods for fabricating such features are described in further detail below. FIG. 4 is a flow diagram illustrating methods 401 for fabricating a 3D IC, in accordance with some embodiments. Methods 401 may be practiced to fabricate any of IC structures 100, 200, or 300, for example.

Methods 401 begin at block 405 where a substrate is received. The substrate advantageously includes a monocrystalline semiconductor layer, such as a silicon layer, upon which FEOL FETs may be formed. In some embodiments, the substrate received includes FEOL FETs that have been fabricated using any known technique, and that are interconnected with BEOL metallization levels to form FEOL circuitry. In some examples, the FEOL FETs include both n-type and p-type FETs interconnected into a CMOS peripheral circuit.

At block 410, a seed structure is formed on the substrate, for example over a planarized BEOL dielectric material and/or interconnect metallization level that overlays the FEOL circuitry. In some embodiments, at block 410 a physical vapor deposition (PVD) process is employed to form a metal, metal nitride, or metal oxide film over a planarized BEOL dielectric material. Such a film may be deposited to a desired thickness with any deposition parameters known to promote grain formation on an amorphous underlayer. Following film deposition, the seed material film may be patterned with any suitable masking an etch process to define lateral dimensions of individual seed structure(s) to arrive at a seed structure substantially as described elsewhere herein (e.g., seed structure 160 in FIG. 1A).

In some alternative embodiments, at block 410 (FIG. 4) a via may be defined into BEOL dielectric material with any suitable masking and etch process. The BEOL via may be etched through as many dielectric material layers as needed to expose a crystalline seeding surface. In some embodiments, a large diameter via is etched through at least two interconnect metallization levels (e.g., M1 and M2) with any suitable anisotropic etch process. Following opening of a via, any epitaxial process known to be suitable for growing a crystalline material from the seeding surface exposed within the via opening may be practiced to backfill the via opening and arrive at a seed structure substantially as described elsewhere herein for seed structure 260. In some examples, Ge or SiGe, or a III-V material is epitaxially grown within a via opening that lands on an underlying silicon substrate. A growth technique suitable for forming raised source/drain semiconductor may be employed at block 410, for example. In some embodiments, the epitaxial growth selectively forms a seed structure within the via opening with no seed material deposited outside of the via opening. If seed material is deposited outside of the via opening, a planarization process may be employed to remove any such overburden.

With the seed structure formed, methods 401 continue at block 415 where a layer of melt material is deposited over the seed structure, and over any dielectric material not masked by the seed structure (e.g., adjacent dielectric material). For example, any of physical vapor deposition (PVD), chemical vapor deposition (CVD), e-beam deposition (EBD), or pulsed laser deposition (PLD) may be employed to deposit a thin film of melt material that can been subsequently crystallized. The layer of melt material may be deposited to thickness of less than 30 nm, for example. In an as-deposited state, the layer of melt material may be amorphous or polycrystalline, for example. The layer of melt material may have any material composition and microstructure that can then be made more crystalline during a subsequent regrowth. In some embodiments, the melt material is substantially pure Ge. In some other embodiments, the melt material is a III—V alloy, and more specifically at least a ternary alloy (e.g., comprising at least In, Ga, and As). Any deposition process known to be suitable for the desired material composition may be practiced at block 415. In some embodiments, a chemical vapor deposition (CVD) process is performed. In some such embodiments, a metal-organic CVD (MOCVD) process is performed. In other embodiments, a molecular beam deposition process is performed.

At block 420 the melt material is crystallized from a grain of the seed structure. In some exemplary embodiments, a rapid melt growth technique is employed to crystallize the melt material, advantageously without significantly dissolving the seed structure (e.g., by forming eutectic, etc.). Rapid melt growth may include, for example, depositing a dielectric material (e.g., SiO by CVD to a thickness of 100 nm-1 µm) over the layer of melt material, for example to limit thermal decomposition of the melt material. In some embodiments, a layer of SiO is deposited by CVD, for example. In other embodiments, a low-k material is deposited by a gap-filling technique, such as, but not limited to, sub-atmospheric flowable oxide deposition techniques and/or spin-on application techniques. Some exemplary flowable dielectrics are polymers that are subsequently treated with one or more chemical processes and/or thermal processes to cure and densify the dielectric material. Any suitable rapid thermal process tool may then be employed to locally heat the layer of melt material (e.g., in a nitrogen ambient) to a predetermined melt temperature suitable for the specific composition. A predetermined cooling rate (e.g., 10-100° C./s) may then be maintained to achieve a predetermined extent of melt material crystallization.

In some embodiments, a BEOL crystallized semiconductor material layer is employed as a template for one or more non-planar semiconductor bodies. Methods 401 may therefore further include block 425, which is denoted in dashed line to emphasize that formation of non-planar bodies from the crystallized semiconductor template material is an option, for example where the template material is not the desired channel semiconductor and/or is not suitable for implementing a specific device architecture (e.g., a finFET architecture). To serve as a template, the crystallized semiconductor material layer may be first patterned into isolated features, or openings may be formed in an overlying dielectric material to expose a region of the crystallized semiconductor material. In either patterning method, semiconductor material may be epitaxially grown upon any exposed template surface. For example, in further reference to FIG. 3, dielectric material 126 may be deposited over islands of semiconductor material 144 to form the non-planar semiconductor bodies 370. Openings (e.g., trenches) may then be patterned into dielectric material 126 with a surface of semiconductor material 144 exposed at a bottom of the openings. An epitaxial growth process may then be employed to backfill the openings. Dielectric material 126 may be planarized and/or etched back to expose a sidewall of non-planar semiconductor bodies 370.

Methods 401 (FIG. 4) continue at block 430 with formation of transistor terminals to either the crystalline melt material, or to a non-planar semiconductor body that was grown upon the crystalline melt material. Terminal formation may comprise any impurity doping of semiconductor source and drain regions, deposition of one or more gate dielectrics, and formation of source, drain, and gate terminal metallization. In some embodiments, both n-type (e.g., NMOS) and p-type (e.g., PMOS) terminals are formed to implement complementary devices within BEOL circuitry. Methods 401 then complete at block 450 where one or more levels of interconnect metallization are fabricated, for example to interconnect BEOL circuitry, and to couple that BEOL circuitry with FEOL circuitry.

Figure 5:
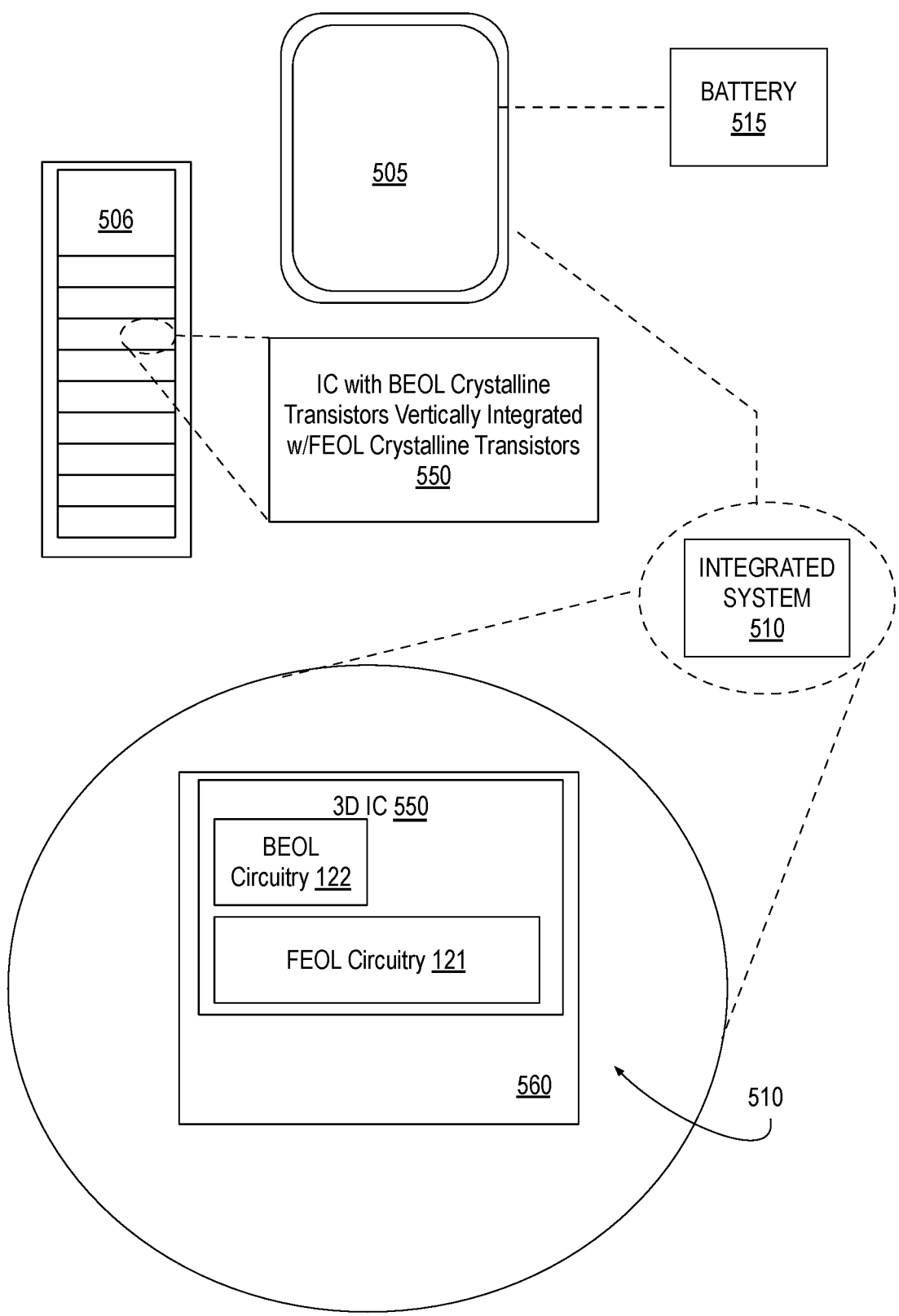
FIG. 5 illustrates a mobile computing platform and a data server machine including a 3D IC structure, in accordance with some embodiments.

FIG. 5 illustrates a mobile computing platform and a data server machine employing a 3D IC 550 including BEOL transistors with crystalline channel semiconductor, for example as described elsewhere herein. The server machine 506 may be any commercial server, for example including any number of high-performance computing platforms disposed within a rack and networked together for electronic data processing. The mobile computing platform 505 may be any portable device configured for each of electronic data display, electronic data processing, wireless electronic data transmission, or the like. For example, the mobile computing platform 505 may be any of a tablet, a smart phone, laptop computer, etc., and may include a display screen (e.g., a capacitive, inductive, resistive, or optical touchscreen), a chip-level or package-level integrated system 510, and a battery 515.

Within the integrated system 510 there is a substrate 560 upon which there is 3DIC 550 including both FEOL circuitry 121 and BEOL 122, either or both of which may have any of the features described elsewhere herein. Either of BEOL and FEOL circuitry 121 and 122 may be further coupled to an antenna (not shown) to implement any of a number of wireless standards or protocols, including but not limited to Wi-Fi (IEEE 1402.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 6:
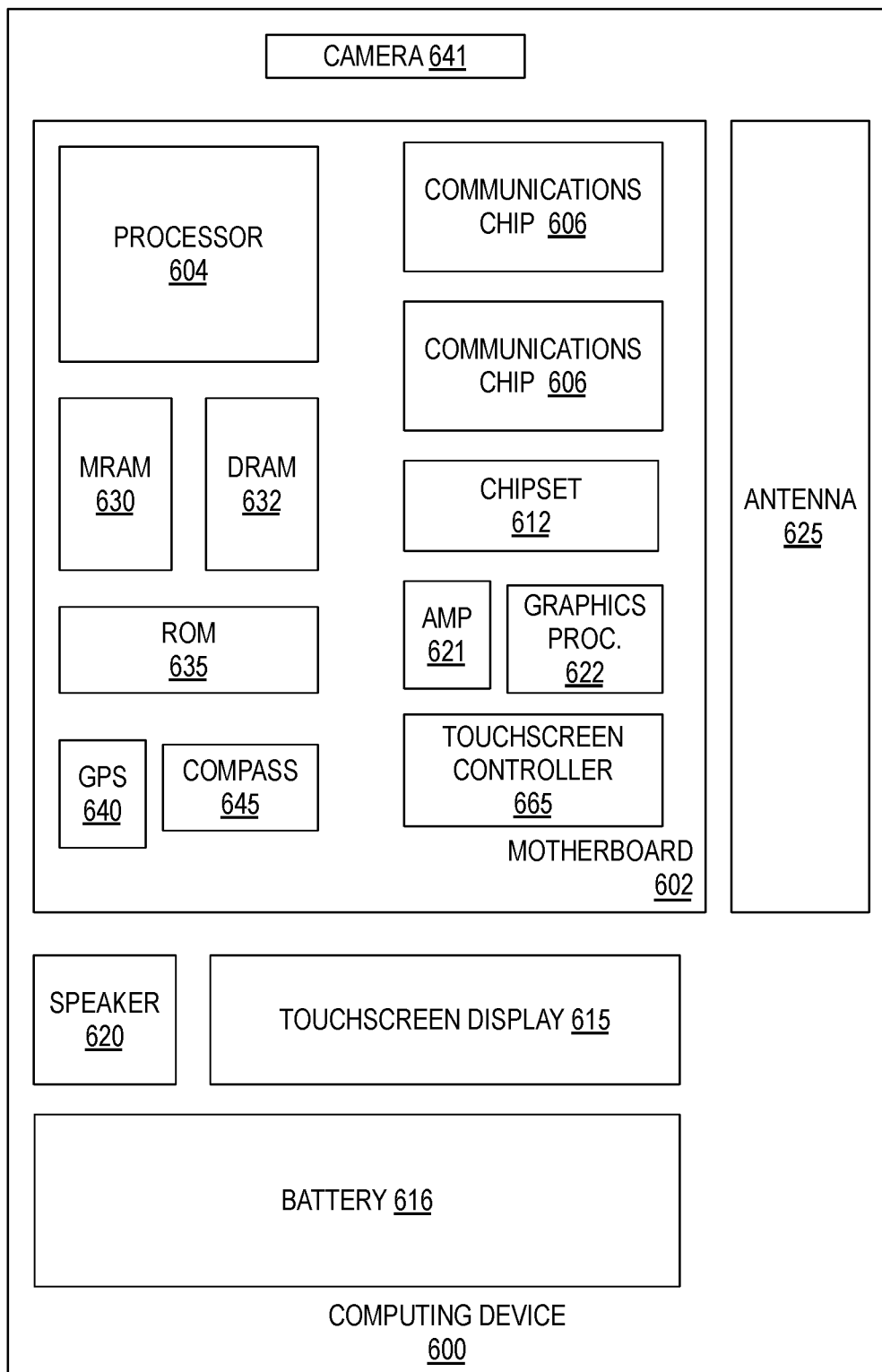
FIG. 6 is a functional block diagram of an electronic computing device, in accordance with some embodiments.

FIG. 6 is a functional block diagram of an electronic computing device 600, in accordance with some embodiments. Device 600 further includes a motherboard 602 hosting a number of components, such as, but not limited to, a processor 604 (e.g., an applications processor). Processor 604 may be physically and/or electrically coupled to motherboard 602. In some examples, processor 604 includes a 3D IC structure, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 606 may also be physically and/or electrically coupled to the motherboard 602. In further implementations, communication chips 606 may be part of processor 604. Depending on its applications, computing device 600 may include other components that may or may not be physically and electrically coupled to motherboard 602. These other components include, but are not limited to, volatile memory (e.g., DRAM 632), non-volatile memory (e.g., ROM 635), flash memory (e.g., NAND or NOR), magnetic memory (MRAM 630), a graphics processor 622, a digital signal processor, a crypto processor, a chipset 612, an antenna 625, touchscreen display 615, touchscreen controller 665, battery 616, audio codec, video codec, power amplifier 621, global positioning system (GPS) device 640, compass 645, accelerometer, gyroscope, speaker 620, camera 641, and mass storage device (such as hard disk drive, solid-state drive (SSD), compact disk (CD), digital versatile disk (DVD), and so forth), or the like. In some exemplary embodiments, at least one of the functional blocks noted above comprise an IC including a transistor structure with a back-side contact metallization to deep source and/or drain semiconductor for example as described elsewhere herein.

Communication chips 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 606 may implement any of a number of wireless standards or protocols, including but not limited to those described elsewhere herein. As discussed, computing device 600 may include a plurality of communication chips 606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In first examples, an integrated circuit (IC) structure comprises a first device level comprising a first transistor, the first transistor comprising a substantially monocrystalline first material. The IC structure comprises a second device level comprising a second transistor and a seed structure, wherein the seed structure comprises a crystalline second material, and wherein the second transistor comprises a third material having a different composition than that of the second material, and having a crystallinity associated with a crystal grain of the second material. The IC structure comprises dielectric material between the first device level and the second device level, and one or more interconnect metallization levels coupled to terminals of the first transistor and the second transistor.

In second examples, for any of the first examples the second material has a higher melting temperature than the third material.

In third examples, for any of the first through second examples the third material is either substantially monocrystalline or comprises a plurality of grains that have a texture associated with the crystal grain of the third material.

In fourth examples, for any of the first through third examples the second device level comprises a third transistor comprising the third material, and the third material of the second transistor has the same crystallinity as the third material of the third transistor.

In fifth examples, for any of the first through fourth examples, the second material is in contact with the first material, and the third material is epitaxial to the first material.

In sixth examples, for any of the first through third examples the second device level comprises a third transistor comprising the third material, and the third material of the second transistor has different crystallinity than the third material of the third transistor.

In seventh examples, for any of the sixth examples the second material is separated from the first device level by the dielectric material.

In eighth examples, for any of the seventh examples the seed structure is a first seed structure, and the second device level further comprises a second seed structure comprising the second material. The second material of the first seed structure has different crystallinity than that of the second material of the second seed structure. The third material of the second transistor has the same crystallinity as that of the second material of the first seed structure.

The third material of the third transistor has the same crystallinity as that of the second material of the second seed structure.

In ninth examples, for any of the first through eighth examples the second material comprises a metal, a metal nitride, or a semiconductor.

In tenth examples, for any of the ninth examples the second material comprises at least one of Ti, Al, or nitrogen.

In eleventh examples, for any of the ninth examples the second material comprises at least one of Ge or Si.

In twelfth examples, for any of the ninth examples the third material has a different composition than the first material.

In thirteenth examples, for any of the twelfth examples the third material is a group III-V semiconductor comprising at least one of In, Ga, and As.

In fourteenth examples, a method of fabricating an integrated circuit (IC) comprises receiving a substrate comprising a dielectric material over first device level, wherein the first device level includes a first transistor, the first transistor comprising a substantially monocrystalline first material. The method comprises forming a seed structure over a portion of the dielectric material, the seed structure comprising a second material. The method comprises depositing a third material over the seed structure, and over the dielectric material. The method comprises crystallizing the third material from a crystal grain of the second material, and forming a second transistor comprising the third material, or another material epitaxial to the third material.

In fifteenth examples, for any of the fourteenth examples forming the seed structure further comprises depositing a metal or metal nitride over the dielectric material, and patterning the metal or metal nitride into structure that has a lateral dimension less than 200 nm. Alternatively, forming the seed structure further comprises exposing the first material by forming an opening through the dielectric material, and epitaxially growing the second material within the opening.

In sixteenth examples, for any of the fourteenth through fifteenth examples, the method further comprises patterning the third material into separate features after the crystallizing.

In seventeenth examples, for any of the sixteenth examples the method further comprises epitaxially growing a semiconductor material on each of the separate features.

In eighteenth examples, a computer platform comprises a power supply, and a three-dimensional integrated circuit (3DIC) coupled to receive power from the power supply. The 3DIC further comprises a first device level comprising a first transistor, the first transistor comprising a substantially monocrystalline first material. The 3DIC further comprises a second device level comprising a second transistor and a seed structure. The seed structure comprises a crystalline second material, and wherein the second transistor comprises a third material having a different composition than that of the second material, and having a crystallinity associated with a crystal grain of the second material. The 3DIC further comprises a dielectric material between the first device level and the second device level. The 3DIC further comprises a first interconnect metallization level between the first device level and the second device level, the first interconnect metallization coupled to one or more terminals of the first transistor. The 3DIC further comprises a second interconnect metallization level over the second device level, the second interconnect metallization coupled to one or more terminals of the second transistor.

In nineteenth examples, for any of the eighteenth examples, the platform further comprises at least one of a wireless radio or a display.

In twentieth examples, for any of the nineteenth examples the first material comprises silicon, the second material comprises germanium and the third material comprises an alloy of Group III element, and a Group IV element.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) structure, comprising:
    a first device level comprising a first transistor, the first transistor comprising a substantially monocrystalline first material;
    a second device level comprising a plurality of second transistors having a lateral pitch of 100 nm, or less, within an area surrounding a plurality of seed structures having a lateral pitch of at least 1 µm, wherein the seed structures comprise a crystalline second material, and wherein each of the plurality of second transistors comprise a third material having a different composition than that of the second material, and having a crystallinity associated with a crystal grain of the second material;
    a dielectric material between the first device level and the second device level; and
    one or more interconnect metallization levels coupled to terminals of the first transistor and the second transistors.

2. The IC structure of claim 1, wherein the second material has a higher melting temperature than the third material.

3. The IC structure of claim 1, wherein the third material is either substantially monocrystalline or comprises a plurality of grains that have a texture associated with the crystal grain of the second material.

4. The IC structure of claim 1, wherein:
    the second device level comprises a third transistor comprising the third material; and
    the third material of the second transistors has the same crystallinity as the third material of the third transistor.

5. The IC structure of claim 4, wherein the second material is in contact with the first material, and the third material is epitaxial to the first material.

6. The IC structure of claim 1, wherein:
    the second device level comprises a third transistor comprising the third material; and
    the third material of the second transistors has different crystallinity than the third material of the third transistor.

7. The IC structure of claim 6, wherein the second material is separated from the first device level by the dielectric material.

8. The IC structure of claim 7, wherein:
    the seed structure is a first seed structure, and the second device level further comprises a second seed structure comprising the second material;

the second material of the first seed structure has different crystallinity than that of the second material of the second seed structure;

the third material of the second transistors has the same crystallinity as that of the second material of the first seed structure; and the third material of the third transistor has the same crystallinity as that of the second material of the second seed structure.

9. The IC structure of claim 1, wherein the second material comprises a metal, a metal nitride, or a semiconductor.

10. The IC structure of claim 9, wherein the second material comprises at least one of Ti, Al, or nitrogen.

11. The IC structure of claim 9, wherein the first material comprises silicon and the second material comprises more Ge than the first material.

12. The IC structure of claim 11, wherein the third material has a different composition than the first material.

13. The IC structure of claim 12, wherein the third material is a group III-V semiconductor comprising at least one of In, Ga, and As.

14. A computer platform, comprising:
a power supply; and
a three-dimensional integrated circuit (3DIC) coupled to receive power from the power supply, wherein the 3DIC further comprises the IC structure of claim 1.

15. The computer platform of claim 14, further comprising at least one of a wireless radio or a display.

16. The computer platform of claim 15, wherein the first material comprises silicon, the second material comprises germanium and the third material comprises an alloy of Group III element, and a Group IV element.

* * * * *